(12) United States Patent
Zhu et al.

(10) Patent No.: US 7,894,198 B2
(45) Date of Patent: Feb. 22, 2011

(54) FLASH MEMORY DEVICE WITH A RETRACTABLE PLUG

(75) Inventors: Zhi-Wen Zhu, Kunshan (CN); Jin-Kui Hu, Kunshan (CN); Xue-Yuan Xiao, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 210 days.

(21) Appl. No.: 12/321,711

(22) Filed: Jan. 22, 2009

(65) Prior Publication Data

US 2009/0185355 A1 Jul. 23, 2009

(30) Foreign Application Priority Data

Jan. 22, 2008 (CN) .................... 2008 2 0031421 U

(51) Int. Cl.
*H05K 5/00* (2006.01)
(52) U.S. Cl. ........................ 361/755; 361/737; 439/131
(58) Field of Classification Search ................ 361/755, 361/752, 790, 797, 800, 756, 727, 737; 439/131, 439/135, 136, 296, 325, 326
See application file for complete search history.

(56) References Cited

U.S. PATENT DOCUMENTS

| 6,743,030 | B2 | 6/2004 | Lin et al. |
| 6,991,479 | B2* | 1/2006 | Miao ........................... 439/133 |
| 7,420,803 | B2* | 9/2008 | Hsueh et al. ............ 361/679.41 |
| 7,558,070 | B2* | 7/2009 | Kang .......................... 361/752 |
| 7,708,570 | B2* | 5/2010 | Ni et al. ...................... 439/131 |
| 2009/0124104 | A1* | 5/2009 | Zhu et al. .................... 439/131 |
| 2009/0275224 | A1* | 11/2009 | Ni et al. ....................... 439/131 |

FOREIGN PATENT DOCUMENTS

CN 2735508 10/2005

* cited by examiner

*Primary Examiner*—Hung S Bui
(74) *Attorney, Agent, or Firm*—Wei Te Chung; Andrew C. Cheng; Ming Chieh Chang

(57) ABSTRACT

A flash memory device, includes a case (1) having a chamber and an opening (1120) at one end thereof. A memory module (2) is received in the chamber and has a plug (22) formed at one end thereof. A pole (3) has a first portion (30) received in the chamber to drive the plug of the memory module moving in or out of the opening, and a second portion (31) opposite to the first portion. A revolver mechanism (5) has a main body (51) which is rotatable, and a spindle (52) assembled to the main body and rotatablely coupled to the second portion to drive the pole moving along a linear direction.

18 Claims, 7 Drawing Sheets

FLASH MEMORY DEVICE WITH A RETRACTABLE PLUG

BACKGROUND OF THE INVENTION

1. Field of the Invention

The present invention generally relates to a flash memory device, and more particularly to a flash memory device with a retractable plug.

2. Description of Related Art

A flash memory device is widely used by consumers as an intermedium for accessing data files from one device to another, or like a portable hard drive for installing materials.

Usually, a flash memory device includes a circuit board with a plurality of electronic components, such as driver chip, memory chip, oscillator, resistor, etc. for saving and loading data, functioning as a miniature hard drive or wireless communication/transmission, a plug connected to one end of the circuit board, and a metal shield enclosing the circuit board. The plug extends out of the metal shield for connecting with various peripherals. The plug usually is a Universal Serial Bus (USB) plug. The USB plug is usually housed and protected from dust by a detachable cap.

However, when a flash memory device is connected with a peripherals, such as a computer, its detached cap may be left unnoticed near the computer and lost due to its small size. Once the extra cap is lost, the USB plug cannot be easily shielded from dust.

Hence, an improvement over the prior art is required to overcome the problems thereof.

SUMMARY OF THE INVENTION

According to one aspect of the present invention, a flash memory device comprises a case defining a chamber and an opening at one end thereof. A memory module is received in the chamber and has a plug formed at one end thereof. A pole has a first portion received in the chamber to drive the plug of the memory module moving in or out of the opening, and a second portion opposite to the first portion. A revolver mechanism has a main body for which is rotatable, and a spindle assembled to the main body and rotatablely coupled to the second portion to drive the pole moving along a linear direction.

According to another aspect of the present invention, a flash memory device comprises a case defining a chamber and an opening at one end thereof. A memory module is received in the chamber and is moveable along a length direction in an in-and-out condition extend through said opening. A pole has a first portion received in the chamber and a second portion extending opposite to the first portion. A gear is rotatablely retained on the first portion for urging the memory module moving along the length direction. A revolver mechanism has a main body which is rotatable, and a spindle assembled to the main body and rotatablely coupled to the second portion for driving the pole moving along the length direction.

These and additional objects, features, and advantages of the present invention will become apparent after reading the following detailed description of the preferred embodiment of the invention taken in conjunction with the appended drawings.

DETAILED DESCRIPTION OF THE INVENTION

Figure 1:
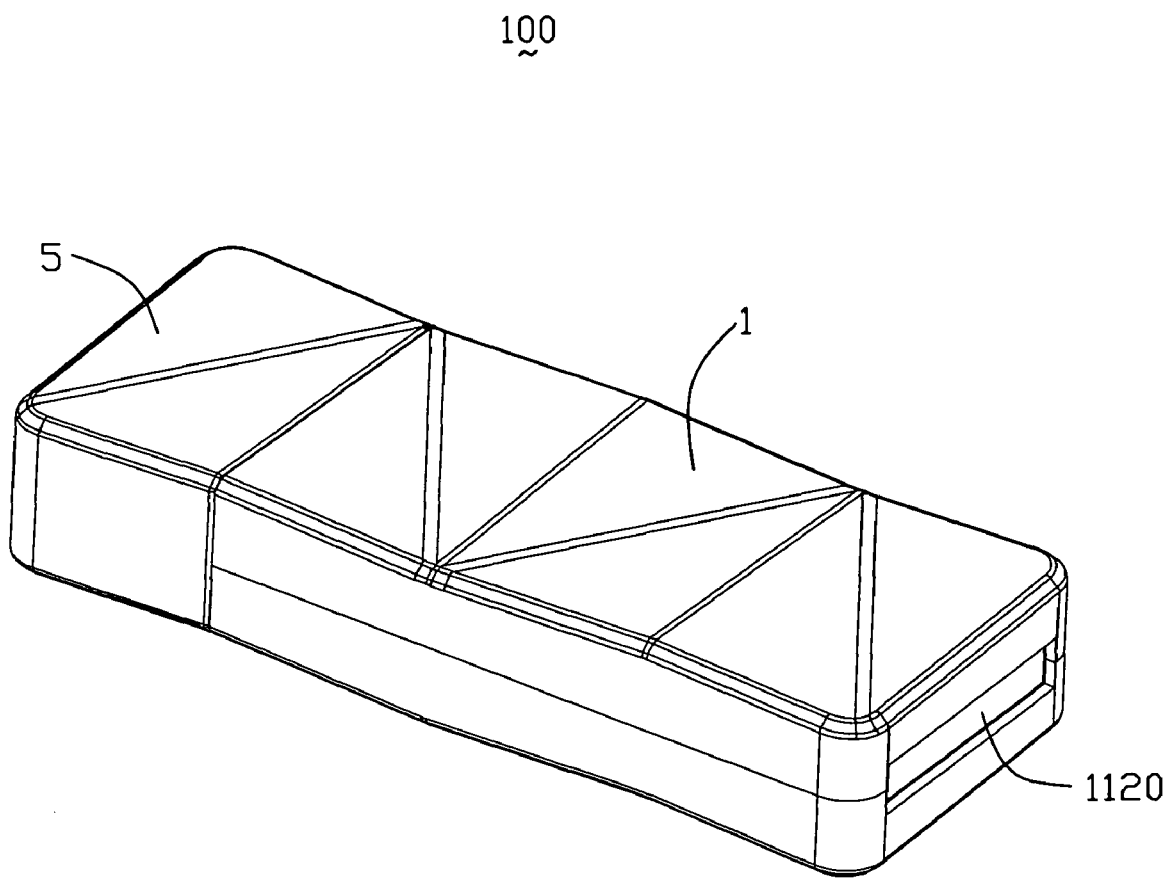
FIG. 1 is a perspective view of the preferred embodiment of a flash memory device according to the present invention.

Reference will now be made to the drawing figures to describe the preferred embodiment of the present invention in detail.

Figure 2:
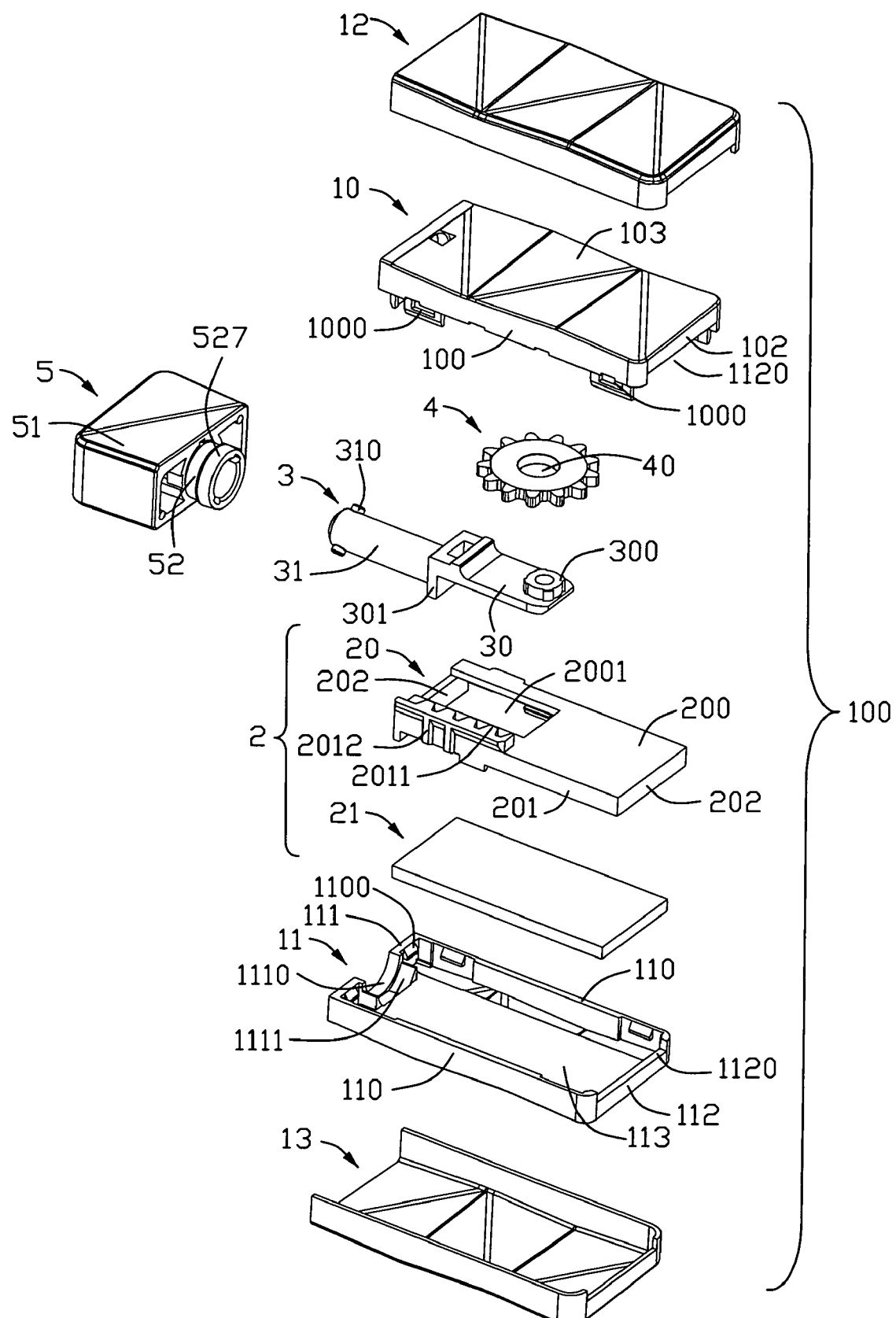
FIG. 2 is a partly exploded view of the flash memory device shown in FIG. 1.
Figure 3:
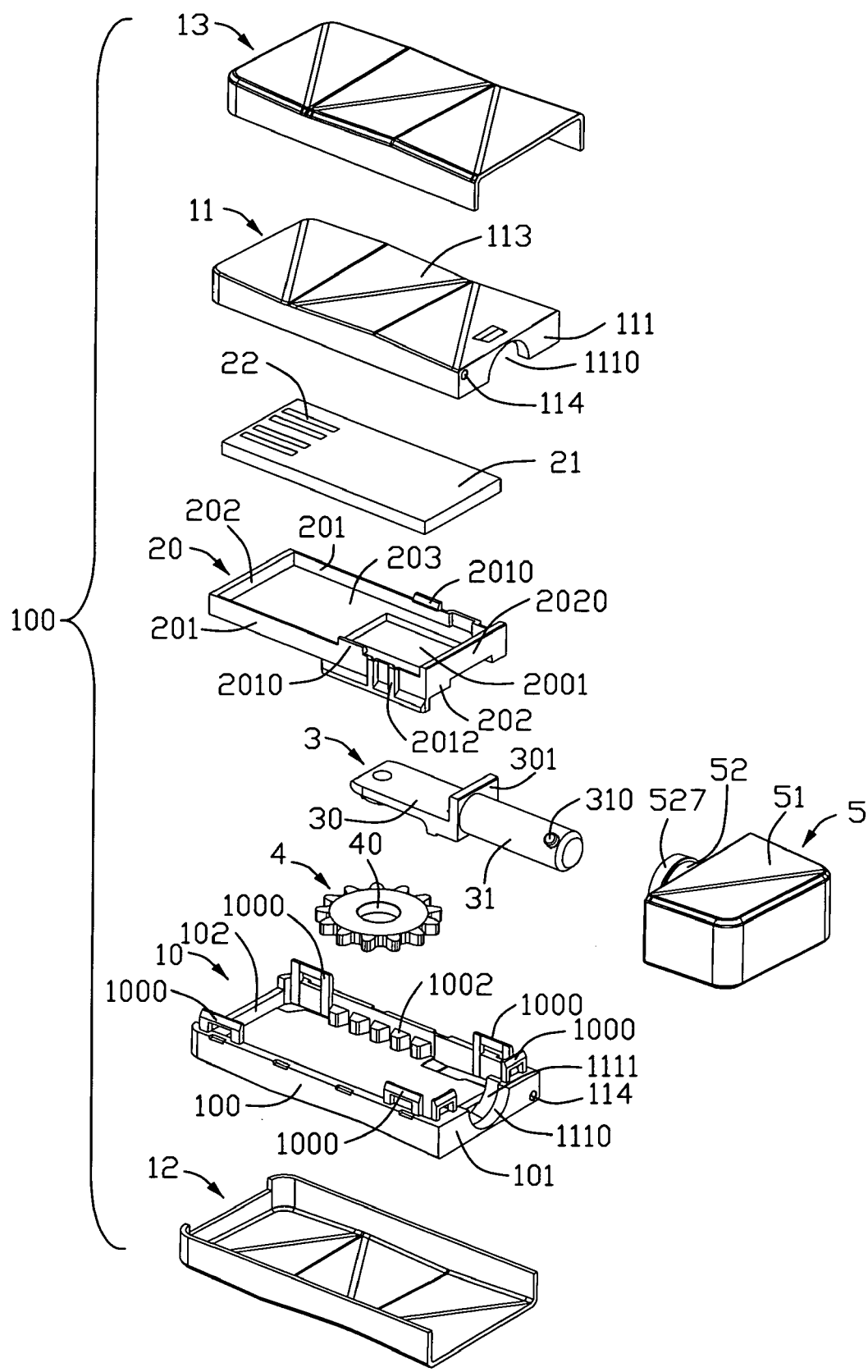
FIG. 3 is a view similar to FIG. 2, while taken from another aspect.

Referring to FIGS. 1-3, the flash memory device 100 according to the present invention, includes a memory module 2, a case 1 enclosing the memory module 2, a pole 3 coupled to the memory module 2, a gear 4 rotatablely retained on the pole 3 and a revolver mechanism 5 coupled to a rear end of the case 1. The memory module 2 includes a movable housing 20 and a circuit board 21 retained therein. The circuit board 21 is coupled with a plurality of electronic components, such as driver chip, memory chip, oscillator, resistor, etc. for saving and loading data, functioning as a miniature hard drive, and has a plug 22 at one end thereof.

Referring to FIGS. 2 and 3, the case 1 includes a pair of inner cases forming a chamber for receiving the memory module 2 and a pair of outer cases covering the inner cases. The inner cases include a first inner case 10 and a second inner case 11 coupled with each other.

The second inner case 11 has a pair of opposed second side walls 110, a second joining wall 111 for connecting the second side walls 110, a second mating wall 112 and a bottom wall 113. A length direction along the memory module 2 is a first direction A. A level direction perpendicular to the first direction A is a second direction B. A plurality of protrusions 1100 extend inwardly from inside of the second side walls 110 and the second joining wall 111 for locking with the first inner case 10. The second inner case 11 has an arc mounting hole 1110 at the second joining wall 111 and a depression 1111 at front of the arc mounting hole 1110. The second mating wall 112 has a rectangular opening 1120 for the plug 22 in and out.

The first inner case 10 has a pair of first side walls 100 corresponding to the second side walls 110, a first joining wall 101 for connecting the first side walls 100, a first mating wall 102 opposed to the first joining wall 101, and a top wall 103 corresponding to the bottom wall 113. A plurality of latches 1000 extend downwardly form the first side walls 100 and the first joining wall 101 for locking with the protrusions 1100 of the second inner case 11. A first rack 1002 extends inwardly form one first side wall 100 along the first direction A for meshing with one side of the gear 4. the first inner case 10 has an arc mounting hole 1110 at the first joining wall 101 and a depression 1111 at front of the arc mounting hole 1110. the arc mounting holes 1110 of the first and second inner case 10, 11 form a circular mounting hole 1110 for receiving the revolver mechanism 5. the first mating wall 102 has a rectangular opening 1120 corresponding to that of the second mating wall 112. Each first and second joining wall 101, 111 has a recess 114 at a rear face.

The outer case includes a first outer case 12 and a second outer case 13 covering the first inner case 10 and the second inner case 11 respectively.

The movable housing 20 is a rectangular insulator which has a flat portion 200, a pair of side walls 201 extending downwardly from two sides of the flat portion 200, and a pair of two end walls 202 connecting the side walls 201. The flat portion 200 has a rectangular space 2001. One of the side walls 201 has a second rack 2011 corresponding to the first rack 1002 of the first inner case 10. a receiving room 203 is formed between the flat portion 200, two side walls 201 and two end walls 202 for receiving the circuit board 21. A plate 2020 extends downwardly from one end walls 202 far from the plug 22. Another end wall 202 affixed to the plug 22 locates in the opening 1120. the plate 2020 moves on the bottom wall 113 of the second inner case 11 along the first direction A for driving the plug 22 out of or into the case 1. A pair of fasteners 2010 extend from side walls 201 for fastening the circuit board 21 in the receiving room 203. Each side wall 201 has a pair of flanges 2012 abutting against the second side walls 110 of the second inner case 11 for preventing the memory module 2 moving along the second direction B.

The pole 3 has a flat first portion 30 received in the space 2001 and located between the first rack 1002 and the second rack 2011, a cylindrical second portion 31 opposite to the first portion 30 coupled to the revolver mechanism 5, and a linking portion 301 located between the first portion 30 and the second portion 31. The first portion 30 has a pivot 300. The gear 4 has a perforation 40 attached to the pivot 300 and for rotating around the pivot 300. The gear 4 is located between the first and second racks 1002, 2011 for meshing with the first and second racks 1002, 2011 simultaneously. The linking portion 301 abuts against one end of the movable housing 20 when the plug 22 hides in the case 1. The second portion 31 has a pair of screws 310 and defines an axes X. The revolver mechanism 5 can rotate around the axes X for driving the pole 3 moving along the first direction A.

Figure 4:
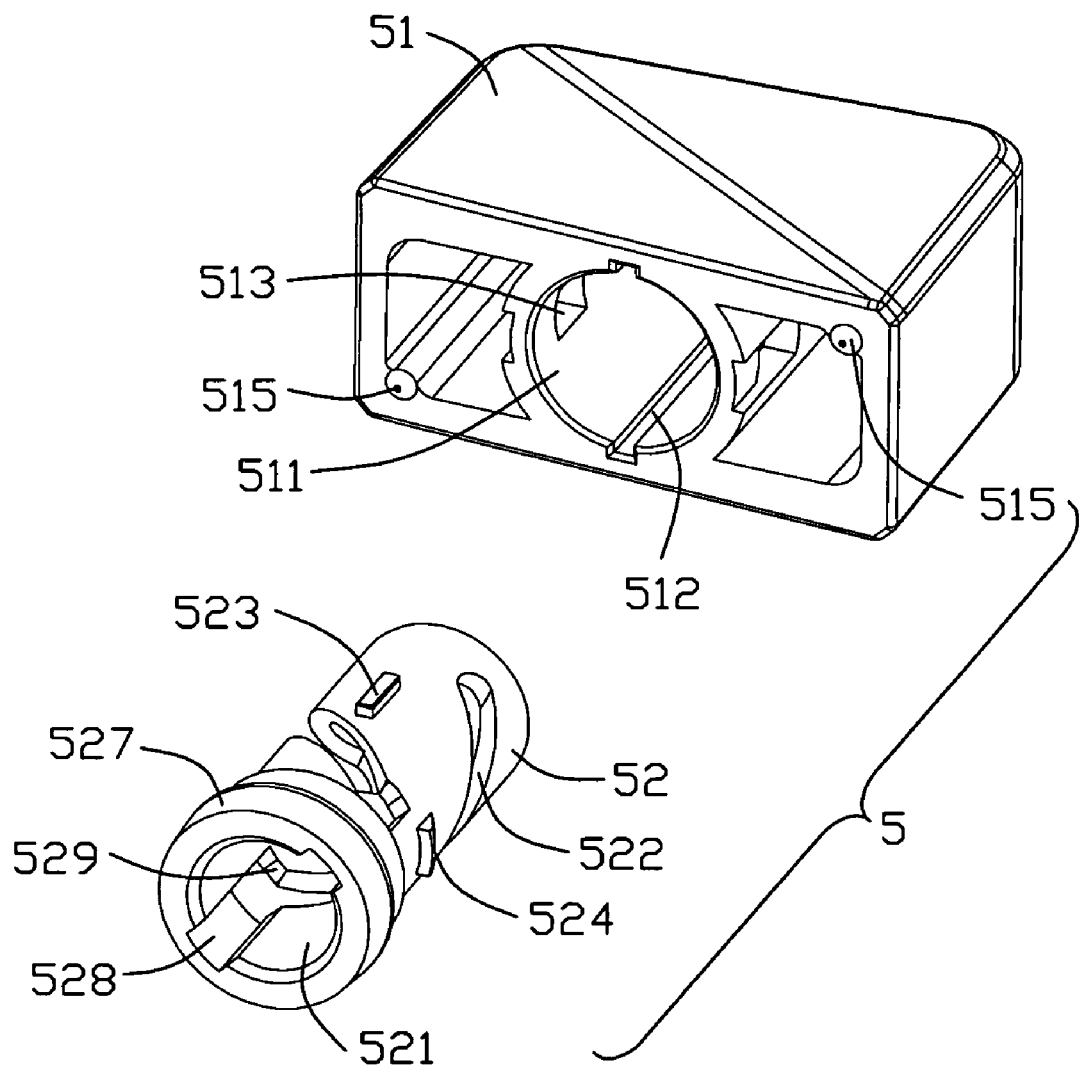
FIG. 4 is an exploded view of a revolver mechanism of the flash memory device shown in FIG. 1.
Figure 5:
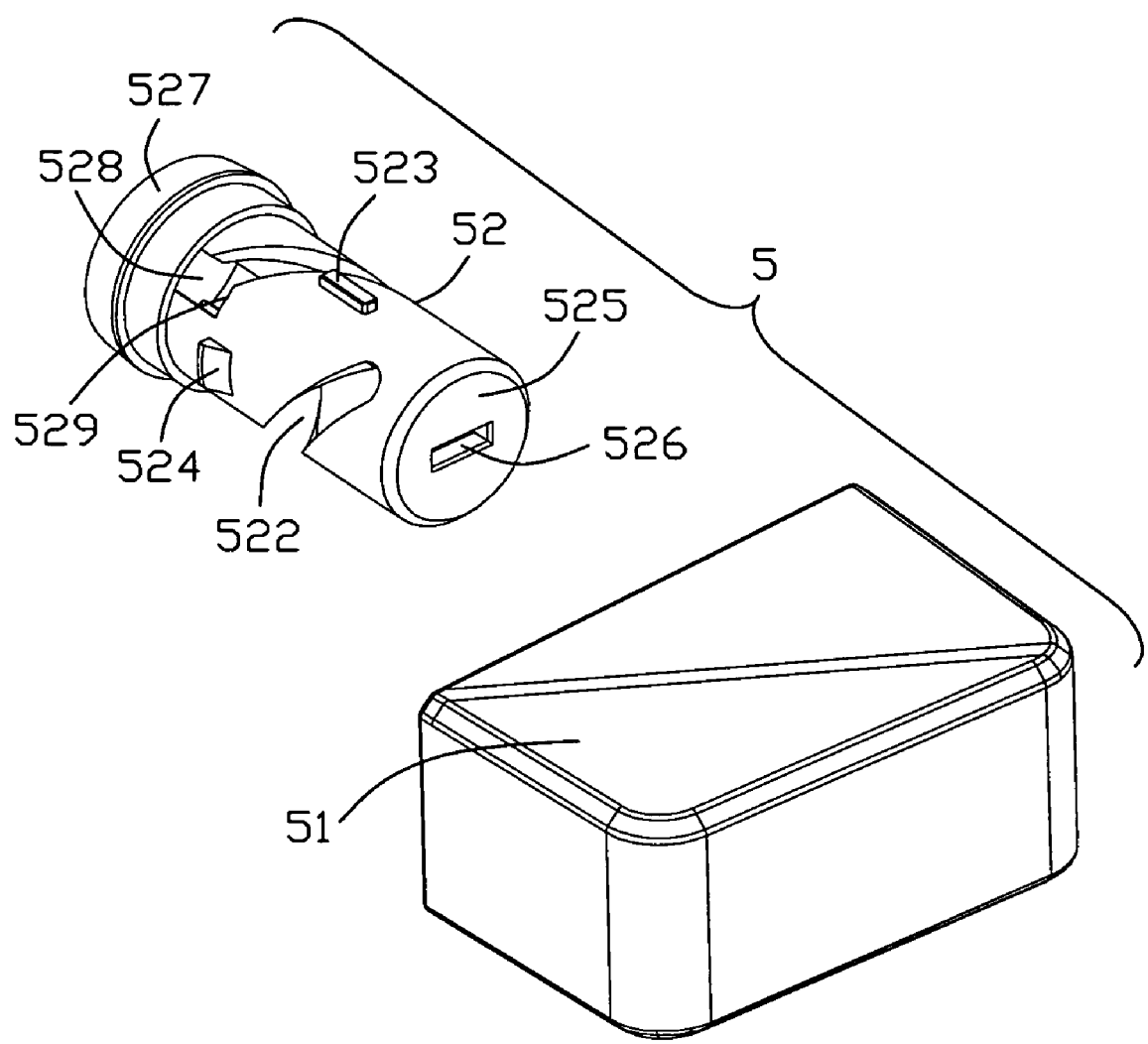
FIG. 5 is a view similar to FIG. 4, while taken from another aspect.

Referring to FIGS. 4 and 5. The revolver mechanism 5 includes a main body 51 and a columned spindle 52 assembled into the main body 51. The main body 51 has a first slot 511, a pair of grooves 512 communicating with the first slot 511, a pair of cavities 513 at two sides of the first slot 511 and a pair of embossments 515 at a front face thereof for being received in the recesses 114. The spindle 52 has a second slot 521 for receiving the second portion 31 of the pole 3 and a pair of spiral slots 522 communicating with the second slot 521 to allow for the screws 310 sliding therein. A pair of guiding slots 528 are located at front of the spiral slots 522 for guiding the screws 310 into the spiral slots 522. The spindle 52 has a pair of limiting portions 529 at front ends of the spiral slots 522 for preventing the screws 310 moving backwards automatically. The spindle 52 has a pair of ribs 523 received in the grooves 512 for preventing the spindle 52 from rotating relative to the main body 51 and a pair of projections 524 locking with the cavity 513 for fastening the spindle 52 to the main body 51. The spindle 52 has a rear wall 525 at a rear end of the second slot 521. A through hole 526 is formed on the rear wall 525 and communicates with the second slot 521 for receiving a block (not shown) on the main body 51. The spindle 52 is rotatablely received in the mounting hole 1110 and has an enlarged stand off 527 at a front end thereof for being rotatablely received in the depression 1111. Therefore the revolver mechanism 5 could be retained in the case 1 stably. The main body 51 and the spindle 52 which are fitted together as a revolver mechanism 5 are molded of dielectric material respectively and easily so as to simplify manufacture procedures and facilitate mass production.

Figure 6:
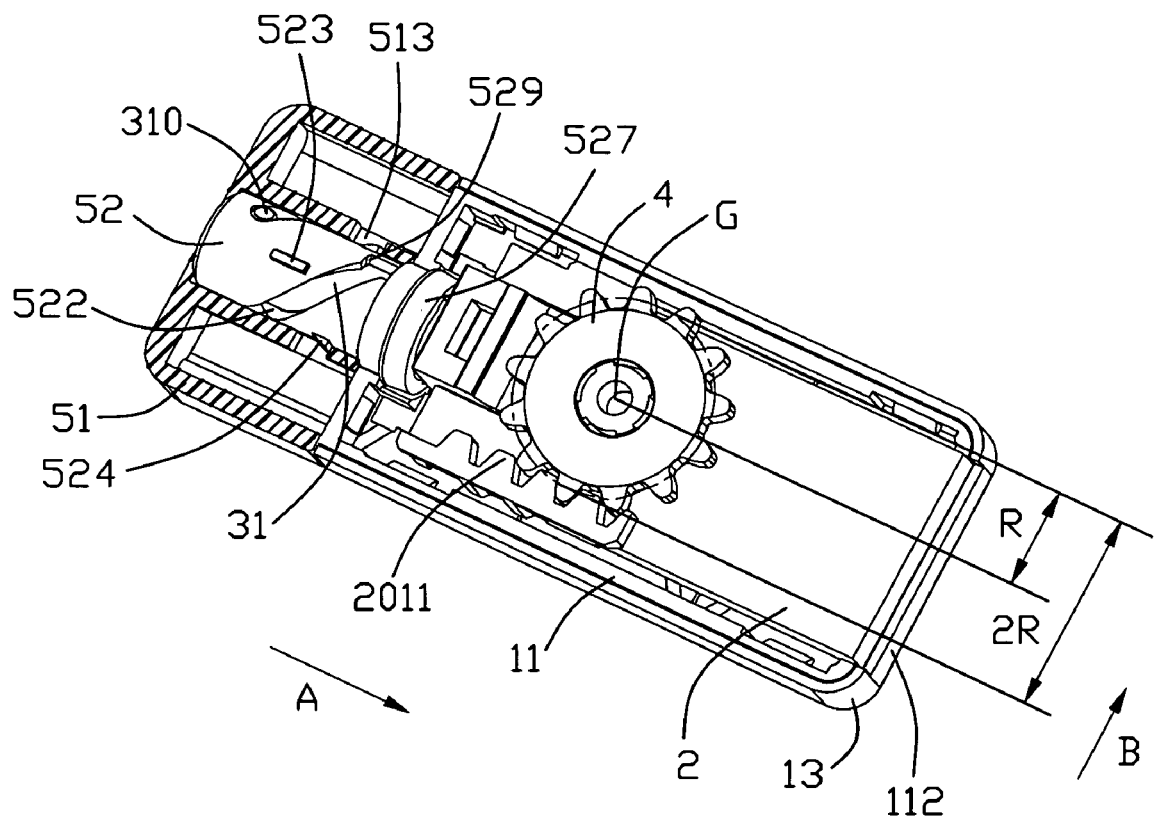
FIG. 6 is a partly perspective view of the flash memory device, which showing a plug is received in a case of the flash memory device.
Figure 7:
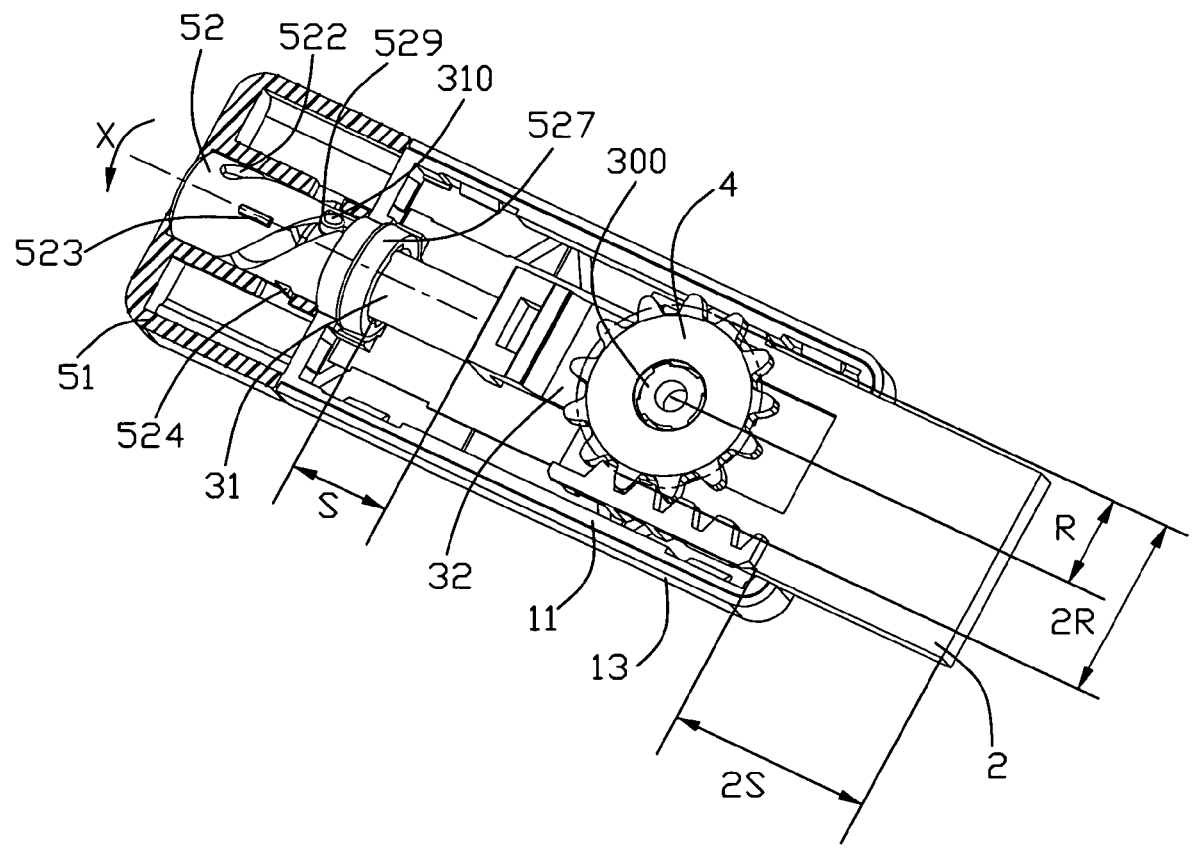
FIG. 7 is a partly perspective view of the flash memory device, which showing the plug extends out of the case of the flash memory device.

Referring to FIGS. 1, 6 and 7, when the plug 22 hides in the case 1, the screws 310 of the pole 3 is located at an end of the spiral slots 522 far from the case 1, and one side of the gear 4 meshes with an end of the first rack 1002 far from the plug 22, and another side of the gear 4 meshes with an end of the second rack 2011 adjacent to the plug 22.

The revolver mechanism 5 in the present invention can not moves relative to the case 1 along the first direction A. When rotating the main body 51 around the axes X, the screws 310 of the pole 3 slide forwardly in the spiral slots 522 of the spindle 52 along the direction A. The gear 4 is moved forwardly due to driving of the pole 3 and rotates around the pivot 300 at the same time. Because the case 1 is unmovable relative to the revolver mechanism 5 along the first direction A, the first rack 1002 meshing with one side of the gear 4 is unmovable relative to the revolver mechanism 5 too. However, the memory module 2 is movable relative to the case 1, thereby the second rack 2011 meshing with another side of the gear 4 is movable relative to the revolver 5. When rotating the main body 51 by 180 degrees, the plug 22 extends out of the case 1, and the screws 310 abut against the limiting portions 529 for preventing the pole 3 moving backwards.

Because the first rack 1002 is unmovable and one side of the gear 4 is moving along the first rack 1002, thereby the first rack 1002 can be seen as an axes of the gear 4 moving forwardly. Movement direction of the screw 3 passes through one point of the gear 4. The speed and distance of the point is same to that of the pole 3. The distance between the point and the first rack 1002 along the second direction B is r. That is to say, distance between the point and the axes is r, distance between another side of the gear 4 meshing with the second rack 2011 and the axes is n times as long as r. Speed of the point is v, and movement time is t, according to formula of linear speed: $v=2\pi r/t$, speed of another side of the gear 4 meshing with the second rack 2011 is n times as gear as v. According to formula of distance: journey is time multiplying speed, time of the point and the second rack 2011 moving is same, thereby journey of the second rack 2011 is n times as long as that of the point.

The movement direction of the pole 3 in the present invention passes through centre G of the gear 4, thereby said point is the centre G of the gear 4. Distance between the centre G and the axes is R, thereby speed of the centre G is $2\pi r/t$ according to above description. Distance between the another side of the gear 4 meshing with the second rack 2011 and the axes is double R, thereby speed of the second rack 2011 is two times as great as that of the centre G. When rotating the main body 51 by 180 degrees along a clock direction, journey of the pole 3 moving is S, thereby journey of the second rack 2011 is double S, that is to say, journey of the memory module 2 is magnified to double S. It is obvious that the memory module 2 can move a longer distance when the pole 3 moves a shorter distance, and the plug 22 can be pushed out of the case 1 easily.

When rotating the main body 51 by 180 degrees along a counterclockwise direction, the pole 3 can drive the plug 22 moving backwardly along the first direction A, and the plug 22 would be hided in the case 1 for dustproof.

According to detail description of the present invention above, the pole 3, the gear 4, the first rack 1002 and second rack 2011 are formed as a magnifying device. Because the first rack 1002 is unmovable, and the second rack 2011 is movable relative to the case 1, the plug 22 can move a longer distance for exposing out of or hiding in the case 1 when the pole 3 moves a shorter distance. The flash memory device 100 of the present invention is easy to be operated, and the pole 3 can not be destroyed easily. In addition, the plug 22 can move out of or in the case 1 when rotating the main body 51 by a changeless degree which is 180 degree in the present invention. The 180 degree is easy to control, thereby the revolver 5 is convenient to be operated. Besides, the main body 51 is located at outside of the case 1 and is unmovable along the first direction A, thereby the main body 51 is easy to rotate by a consumer.

The pole 3 is separated from the movable housing 20 in the present invention, while the pole 3 can extend integrally from one end of the movable housing 20 opposite to the plug 22 in another alternative embodiment. In this way, the flash memory device 100 can only has a case, a movable housing with a pole, a circuit board with plug and a revolver mechanism.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A flash memory device, comprising:
   a case defining a chamber and an opening at one end thereof;
   a memory module received in the chamber and having a plug formed at one end thereof;
   a pole having a first portion received in the chamber to drive the plug of the memory module moving in or out of the opening, and a second portion opposite to the first portion; and
   a revolver mechanism having a main body which is rotatable, and a spindle assembled to the main body and rotatablely coupled to the second portion to drive the pole moving along a linear direction.

2. The flash memory device as claimed in claim 1, wherein the main body has a first slot for receiving the spindle and a groove communicating with the first slot, the spindle has a rib received in the groove for preventing the spindle from rotating relative to the main body.

3. The flash memory device as claimed in claim 2, wherein the main body has a pair of cavities at two sides of the first slot, the spindle has a pair of projections locked with the cavities.

4. The flash memory device as claimed in claim 1, wherein the spindle has a second slot for receiving the second portion of the pole and a spiral slot communicating with the second slot, the second portion has a screw sliding in the spiral slot to actuate the pole to move along the linear direction.

5. The flash memory device as claimed in claim 4, wherein the pole has a rear wall at a rear end of the second slot, the rear wall has a through hole communicating with the second slot, the main body has a block received in the through hole to prevent the spindle from rotating relative to the main body.

6. The flash memory device as claimed in claim 4, wherein the spindle has a guiding slot at a front side of the spiral slot and communicating with the spiral slot for guiding the screw into the spiral slot.

7. The flash memory device as claimed in claim 4, wherein the spindle has a limiting portion at a front end of the spiral slot for preventing the screw from moving backwards automatically.

8. The flash memory device as claimed in claim 1, wherein the spindle has an enlarged standoff at a front end thereof, the case has a mounting hole for rotatablely receiving the spindle and an enlarged depression at a front end of the mounting hole for rotatablely receiving the standoff.

9. The flash memory device as claimed in claim 1, wherein the first portion of the pole is flat, the second portion of the pole is cylindrical.

10. The flash memory device as claimed in claim 1, wherein the memory module comprises a movable housing supported by the first portion of the pole and a circuit board retained therein.

11. The flash memory device as claimed in claim 10, wherein the flash memory device comprises a gear for meshing with the memory module furthermore, the second portion of the pole has a pivot, the gear has a perforation rotating around the pivot.

12. The flash memory device as claimed in claim 11, wherein the case has a first rack extending along a length direction of the memory module for meshing with one side of the gear, the movable housing has a second rack extending along the length direction for meshing with the other side of the gear, the first rack is unmovable, the gear is located between the first rack and the second rack.

13. A flash memory device, comprising:
    a case defining a chamber and an opening at one end thereof;
    a memory module received in the chamber and moveable along a length direction in an in-and-out condition to extend through said opening;
    a pole having a first portion received in the chamber and a second portion extending opposite to the first portion;
    a gear being rotatablely retained on the first portion for urging the memory module moving along the length direction; and
    a revolver mechanism having a main body which is rotatable, and a spindle assembled to the main body and rotatablely coupled to the second portion for driving the pole moving along the length direction.

14. The flash memory device as claimed in claim 13, wherein the main body has a first slot for receiving the spindle and a pair of grooves communicating with the first slot, the spindle has a pair of ribs received in the grooves to prevent the spindle from rotating relative to the main body.

15. The flash memory device as claimed in claim 13, wherein the spindle has a second slot to receive the second portion of the pole and a pair of spiral slots communicating with the second slot, the second portion has a pair of screws sliding in the spiral slots.

16. The flash memory device as claimed in claim 13, wherein the second portion of the pole has a pivot, the gear has a perforation rotating around the pivot, the case has a first rack extending along the length direction for meshing with one side of the gear, the memory module has a second rack extending along the length direction to mesh with the other side of the gear.

17. A flash memory device comprising:
    a case defining therein a chamber communicating with an exterior through a front opening;
    a memory module receiving in the chamber;
    a pole defining opposite front and rear regions;
    a revolver mechanism rotatable relative to the case and engaged with the rear region; wherein
    one of said revolver mechanism and said rear region is provided with a spiral slot and the other with a stud sliding along said slot; wherein
    the memory module is engaged with the front region whereby rotation of the revolver mechanism results in linear movement of the pole that pushes the memory module to move.

18. The flash memory module as claimed in claim 17, further including a gear structure applied upon the case, the front region and the memory module for magnifying movement of the memory module corresponding to movement of the pole.

* * * * *